United States Patent [19]
Kim et al.

[11] Patent Number: 5,821,766
[45] Date of Patent: Oct. 13, 1998

[54] METHOD AND APPARATUS FOR MEASURING THE METALLURGICAL CHANNEL LENGTH OF A SEMICONDUCTOR DEVICE

[75] Inventors: Sung-Ki Kim, Seoul; Jin-Hyoung Kim, Ichon; Dai-Hoon Lee, Seoul; Han-Sub Yoon, Ichon; Myung-Suk Jo, Kangnung, all of Rep. of Korea

[73] Assignee: Hyundai Electronics Industries Co., Ltd., Ich'on, Rep. of Korea

[21] Appl. No.: 603,129

[22] Filed: Feb. 20, 1996

[51] Int. Cl.$^6$ ..................................................... G01R 19/08
[52] U.S. Cl. ............................................. 324/769; 324/765
[58] Field of Search .................................. 324/73.1, 158.1, 324/769, 719, 765; 437/8; 257/40, 48

[56] References Cited

U.S. PATENT DOCUMENTS

| | | | |
|---|---|---|---|
| 5,304,925 | 4/1994 | Ebina ....................................... | 324/719 |
| 5,493,231 | 2/1996 | Nicollian et al. ........................ | 324/769 |
| 5,493,238 | 2/1996 | Takeuchi ................................. | 324/769 |
| 5,519,336 | 5/1996 | Liu et al. ................................. | 324/769 |

OTHER PUBLICATIONS

"A New Method to Determine Effective MOSFET Channel Length", K. Terada et al, *Japanese Journal of Applied Physics*, vol. 18, No. 5, May 1979, pp. 953–959.

"A Modification on 'An Improved Method to Determine MOSFET Channel Length'", J. Whitfield, *IEEE Electron Device Letters*, vol. EDL-6, No. 3, Mar. 1985, pp. 109–110.

"Gate–Voltage–Dependent Effective Channel Length and Series Resistance of LDD MOSFETs", G. Hu et al, *IEEE Transactions on Electron Devices*, vol. ED-34, No. 12, Dec. 1987, pp. 2469–2475.

"A Capacitance Method to Determine the Metallurgical Gate–to–Source/Drain Overlap Length of Submicron LDD MOSFETS", M. Jo et al, *Proc. IEEE Int. Conference on Microelectronic Test Structures*, vol. 8, Mar. 1995, pp. 151–155.

"Semiconductor Material and Device Characterization", D. Schroder, Wiley Pub. New York, 1990, Chapter 6, pp. 254–256. (no month available).

"Oxide–Thickness Determination in Thin–Insulator MOS Structures", B. Ricco et al, *IEEE Transactions on Electron Devices*, vol. 35, No. 4, Apr. 1988, pp. 432–438.

*Primary Examiner*—Vinh P. Nguyen
*Attorney, Agent, or Firm*—Ware, Fressola, Van Der Sluys & Adolphson LLP

[57] ABSTRACT

A method and apparatus for measuring the metallurgical channel length of a semiconductor device includes the steps of determining capacitance of gate to substrate in a multiple MOS transistor pattern and MOS capacitor pattern which have the same gate area; subtracting the capacitance of gate to substrate in a MOS transistor from that in a MOS capacitor for providing a difference curve; determining the overlap length by using the capacitance corresponding to a peak shown in the differences curve; and subtracting two times the overlap length ΔL from the gate length Ldrawn in the MOS transistor for providing the metallurgical channel length.

20 Claims, 8 Drawing Sheets

METHOD AND APPARATUS FOR MEASURING THE METALLURGICAL CHANNEL LENGTH OF A SEMICONDUCTOR DEVICE

TECHNICAL FIELD

The present invention relates to a method and apparatus for measuring the metallurgical channel length of a semiconductor device, particularly a metal oxide semiconductor field effect transistor (MOSFET) device, and more specifically to a method and apparatus for measuring the metallurgical channel length (Lmet) of a semiconductor device which has a Lightly Doped Drain (LDD) MOSFET structure.

BACKGROUND OF THE INVENTION

As the technology of semiconductor devices advances to the degree of very large scale integration (VLSI) and ultra large scale integration (ULSI), the geometry parameters of a Metal Oxide Semiconductor Field Effect Transistor (hereinbelow referred to as "MOSFET") become smaller and the accurate evaluation of channel length becomes increasingly important. Accordingly, methods for the determination of channel length have been studied extensively.

Channel length is of two kinds, i.e., the metallurgical channel length (Lmet) and the effective channel length (Leff), which are quite different from each other. That is, while Leff is varied with the applied bias, Lmet is constant.

The conventional resistance method for determining Leff is based on the gate-bias-dependent source/drain resistance method, with reference to the documents (1) to (3) listed below:

1) K. Terada and H. Muta, "A New Method to Determine Effective MOSFET Channel Length", J. Appl. Phys., vol. 18, pp. 953–959, 1979;
2) J. Whitfield, "A Modification on an Improved Method to determine MOSFET Channel Length", IEEE Elect. Device Lett., vol. EDL-3, pp. 10–12, 1982; and
3) Genda J. Hu, Chi Chang and Yu-Tai Chia, "Gate-Voltage-Dependent Effective Channel Length and Series Resistance of LDD MOSFETs", IEEE Trans. Elect. Devices, vol. ED-34, no. 12, pp. 2469–2475, Dec. 1987.

Leff can also be interpreted as a parameter required to accurately fit the linear region of the drain current characteristics of MOSFETs with different gate lengths under the following assumptions: 1) inversion channel mobility, at the same Vgs—Vth, is channel length independent (where Vgs is the gate to source bias and Vth is the threshold voltage; 2) source and drain resistance is independent of Leff; and 3) the offset between Leff and the mask defined gate length is the same for MOSFETs with different Leff.

On the other hand, Lmet is uniquely defined by the impurity profiles that result from a specific set of processing conditions, and its accurate determination is highly useful to technologists and device engineers.

Accurate determination of Lmet also makes a significant contribution to two very important and yet unachieved goals in TCAD (technology computer-aided design), namely the calibration of two-dimensional process simulators such as SUPREM-IV and the development of a physically based device simulation methodology.

The conventional method of measuring the metallurgical channel length is independent of the applied bias and comprises measuring a capacitance of gate to source/drain, and is described by the documents (4), (5) listed below:

4) B. J. Sheu and P. K. Ko, "A Capacitance Method to Determine Channel Lengths for Conventional and LDD MOSFETs", IEEE Elec. Device Lett., vol. EDL-5, pp. 491–493, 1984; and
5) Shiuh-Wuu Lee, "A Capacitance-Based Method for Experimental Determination of Metallurgical Channel Length of Submicron LDD MOSFETS", IEEE Trans. Elect. Devices, vol. 41, no. 3, pp. 403–412, March, 1994.

Here, the effective channel length is the electrically determined channel length which is used to fit current-voltage (I-V) characteristics of the linear regions in I-V characteristic curves. That is, it is the electrical channel length which is dependent on the applied voltage, whereas the metallurgical channel length is independent of the applied voltage. This metallurgical channel length is an important parameter of modern submicron LDD MOSFET fabrication for accurate process monitoring, process simulation, device scaling, device modeling and device reliability for hot carriers.

Hereinbelow, the conventional method of measuring the metallurgical channel length which is a more important parameter, will be explained.

FIG. 1 is a sectional view showing an LDD MOSFET formed in a P-type silicon substrate.

As shown in FIG. 1, the metallurgical channel length of the MOSFET, Lmet, is the length from the source to the drain at the surface of the silicon substrate. The length of gate electrode in FIG. 1 is expressed by Ldrawn. The conventional method of determining Lmet utilizes a measurement of the capacitance of gate to source or drain (Cgs or Cgd). Recently, Shiuh-Wuu Lee developed a C-V method to determine the metallurgical channel length. As shown in FIG. 2, he measured the gate to source/drain capacitances of finger type patterns with different gate lengths and calculated the metallurgical channel length at Vgs=Vgs$^{on}$ where LDD-gate overlap regions are highly accumulated up to the LDD-gate metallurgical junction.

The conventional art obtained the metallurgical channel length by measuring the formed capacitance of gate to source/drain, but, as shown in FIG. 2, it has a problem in not enabling an accurate determination of metallurgical channel length due to the effect of the parasitic capacitance (Cof) which exists between the edge of gate electrode and the source or drain electrode. In addition, in devices with an LDD structure, the conventional method cannot obtain an accurate measuring result due to the inner parasitic capacitance (Cif) which is generated by the depletion of the carriers in the region of the source or drain.

DISCLOSURE OF INVENTION

Accordingly, it is an object of the present invention to provide a method and apparatus for measuring the metallurgical channel length so as not to be affected by the parasitic capacitance.

According to the present invention, the capacitance of gate to substrate in a multiple MOS transistor pattern is first determined, and then that of a MOS capacitor pattern which have the same gate area at various gate-to-substrate voltages. Next, the so determined capacitances of gate to substrate of the MOS capacitor pattern are subtracted from those of the MOS transistor pattern for each of the various voltages. The differences are expressed by a graph of capacitances vs. gate-to-substrate voltages. Afterwards, a peak point is searched for and determined from the graph. Then the overlap length ΔL is obtained by substituting the capacitance corresponding to the determined peak point in Equation 1 below, and lastly the metallurgical channel length is calculated by substituting the overlap length ΔL in Equation 2 below, wherein ΔL is the overlap length of gate and source/drain; Cpeak is the capacitance corresponding to the peak point in the capacitance difference curve; Cp is the capacitance per unit area of gate to substrate in the MOS capacitor; Nf is the number of MOS transistors connected in parallel in the MOS transistor pattern; Lp is the total channel length of mask for the gate pattern in the MOS transistor pattern and has the relation of Lp=Nf×Ldrawn; Ldrawn is the channel length or drawn single finger gate length in the MOS transistor; and Lmet is the metallurgical channel length:

$$\Delta L = \frac{Cpeak \times Lp}{2CpNf} \quad (1)$$

$$Lmet = Ldrawn - 2\Delta L. \quad (2)$$

Thus, a simple capacitance method is shown to extract the metallurgical channel length of a semiconductor device. Moreover, it will be shown below that this method may also be used to determine a flat-band voltage. This method is verified by a two-dimensional device simulation using MEDICI. This new method uses test patterns which have been widely used for MOSFET capacitance evaluation and the simple formula given above. The peak point of a difference in capacitance values is able to be identified easily, which determines both metallurgical channel length and flat-band voltage. The proposed method is easy to implement, not only for automatic parameter determination, but for process control monitoring (PCM) for use in conjunction with a signal processor in a process control loop.

These and other objects, features and advantages of the present invention will become more apparent in light of the detailed description of a best mode embodiment thereof, as illustrated in the accompanying drawing.

BEST MODE FOR CARRYING OUT THE INVENTION

Hereinbelow, referring to the attached drawings, the preferred embodiments are illustrated.

Figure 1:
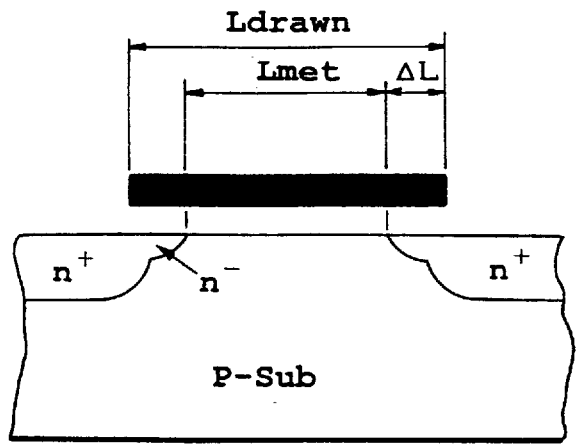
FIG. 1 is a partial sectional view of the general Lightly Doped Drain (LDD) Metal Oxide Semiconductor Field Effect Transistor (MOSFET) with definitions shown according to the prior art.
Figure 2:
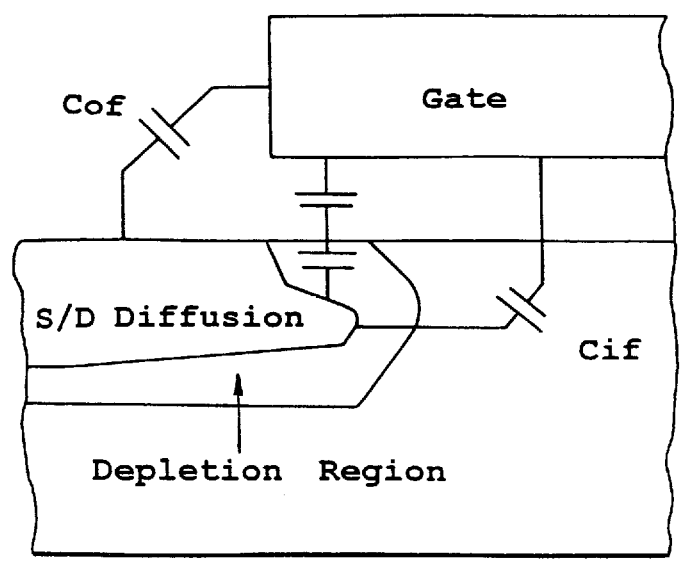
FIG. 2 is a view showing capacitances including parasitic capacitances formed by each element of the LDD MOSFET in FIG. 1 in the case where the conventional method is applied.
Figure 3A:
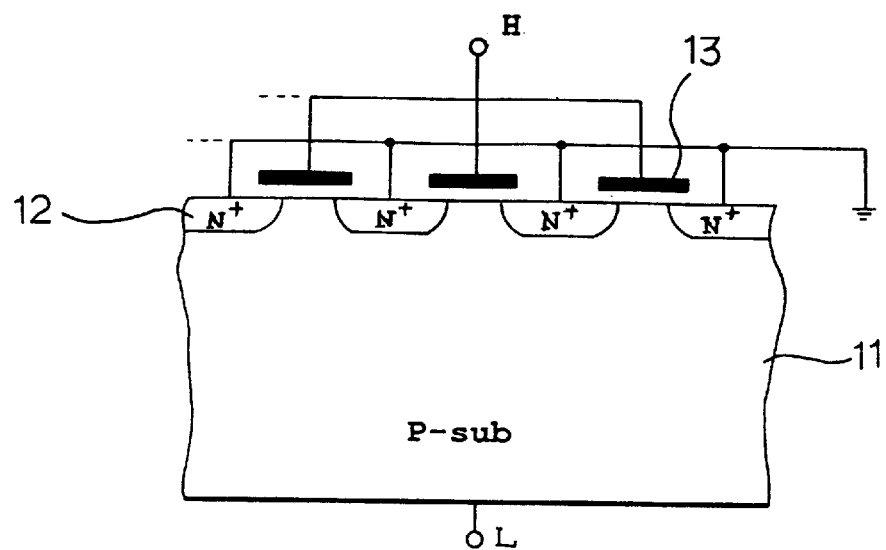
FIG. 3A and FIG. 3B are views showing a MOS transistor pattern which has multiple MOS transistors connected in parallel and a MOS capacitor pattern according to the present invention, respectively.
Figure 3B:
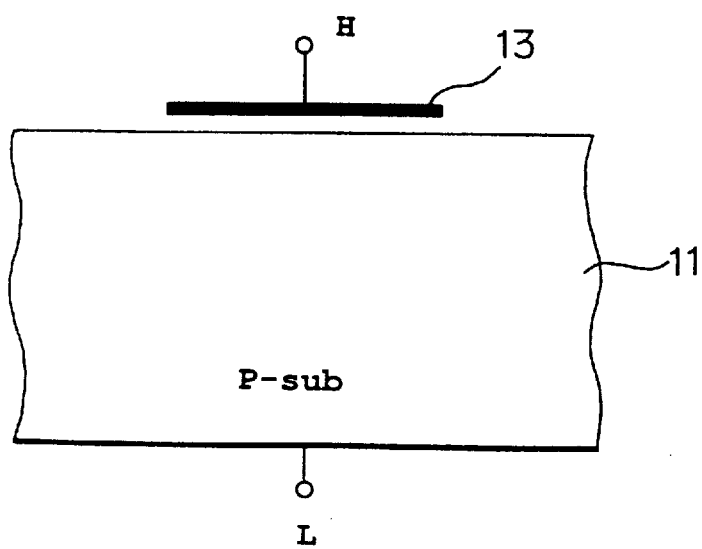

FIG. 3A shows a MOS transistor test pattern, originally designed for the so-called Miller capacitance measurement, and FIG. 3B shows a MOS capacitor test pattern. The two test patterns have a large gate area to minimize the effect of the parasitic capacitances on the measurement of data. And, they have the same gate area. A HP4284A LCR meter is connected to the probes in a shielded probe station for accurate measurement. The source and the drain junctions 12 are respectively grounded to prevent measurement errors of the data due to the P-N junction capacitance. The gates 13 and substrates 11 of both patterns are connected respectively to a high port (H) and a low port (L). DC and 10 kHz low-amplitude AC signals are applied to the gates of the two patterns at various DC levels, e.g., from −5V to 5V, and the gate-to-substrate capacitance of the MOS transistor pattern Cgb and the plate capacitance of the MOS capacitor pattern Cp are measured. In addition, to get the difference capacitance Cdiff, the measured gate-to-substrate capacitances Cgb are subtracted from that of the plate pattern capacitance Cp. The device used for the measurement of capacitance has a single MOS transistor gate length L=0.8 μm, gate width W=200 μm, number of single transistors Nf=250, and capacitance of the gate oxide Cox=3.22 E−3 F/m². The total gate area of each pattern is 4×10⁴ m².

Figure 4:
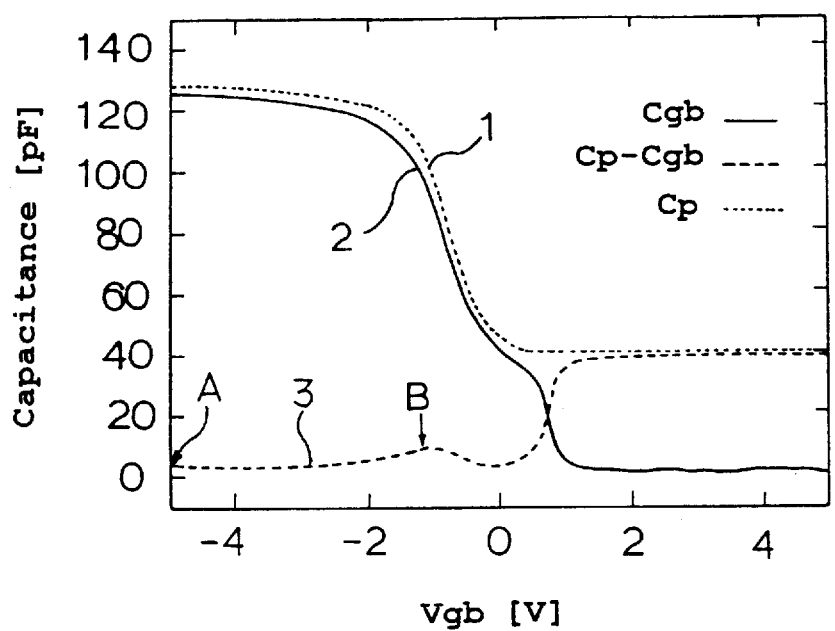
FIG. 4 is a graph showing the capacitances determined by utilizing the MOS transistor pattern and the MOS capacitor pattern of FIG. 3 at various gate-to-substrate voltages.
Figure 5A:
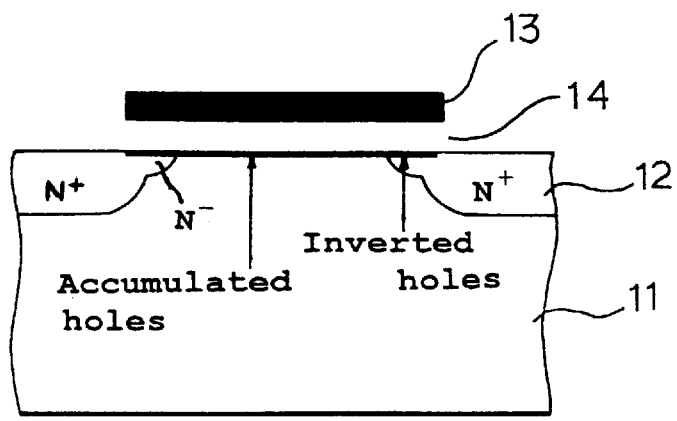
FIGS. 5A and 5B are views showing the relation of the channel length and the width of the gate electrode in a MOS transistor and a MOS capacitor pattern for illustrating the method for measuring the metallurgical channel length, according to the present invention.

In the graph of FIG. 4, the capacitance data of gate-to-substrate in the MOS capacitor pattern is denoted by a reference numeral 1, the capacitance data of gate-to-substrate in the MOS transistor pattern is denoted by a reference numeral 2, and differences between data 1 and data 2 is denoted by a reference numeral 3, which shows a distribution of carriers. When a bias A is applied to the gate to the substrate, e.g., at −5V, an inversion layer is formed at the surface of the LDD region of the source/drain as shown in FIG. 5A so that the holes in the substrate can move into the source and drain region under the gate, and the holes are strongly accumulated at the channel portion of the surface of the substrate 11 under the gates. Accordingly, the capacitance Cgb of gate 13 to substrate 11 in the MOS transistor structure shows a maximum value Cm, as shown in FIG. 4. In the case of the MOS capacitor patterns, the holes are also strongly accumulated at the surface of the substrate under the gates so that the capacitance shows the maximum value, as also shown in FIG. 4. Hence, the capacitance difference of two test patterns Cdiff has the minimum value. As Vgb increases from −5V toward 0V, the holes in the LDD regions move back to the substrate and the inverted length of the overlap region decreases. As a result, Cgb decreases and Cdiff increases until Vgb equals Vm. At Vgb=Vm, Cdiff has a peak value (B) and the accumulated holes under the gate are stopped at the metallurgical junction of the LDD and at the substrate 11 under the gate 13. When Vgb increases further, from Vm toward 0V, the holes, in the substrate 11 under the gate 13, are depleted and Cgb, Cp and Cdiff decrease. As Vgb increases still further, the substrate 11 under the gate 13 becomes inverted, whereas Cp remains a constant value due to inversion capacitance and Cgb becomes negligible because of the gate electric field shielding effect of the source/drain grounded inversion layer.

Figure 5B:
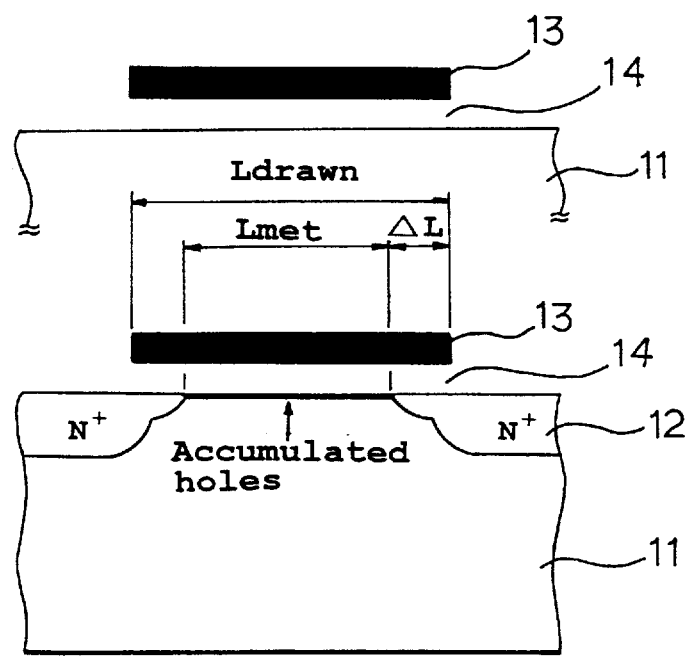

Now, as shown in FIG. 5B, an overlap length, an overlap capacitance and a metallurgical channel length can be determined because the differences between the capacitances in the MOS capacitor patterns and the capacitances in the MOS transistor patterns are first obtained. The relation with other factors is quantitatively expressed by equation 1, $$\Delta L = \frac{Cpeak \times Lp}{2CpNf} \qquad (1)$$

wherein ΔL is the overlap length of gate and source/drain; Cpeak is the capacitance corresponding to a peak point (B) in the capacitance difference curve when a voltage of gate to substrate Vgb is between −2V to 0V; Cp is the capacitance of gate to substrate in the MOS capacitor; Nf is the number of MOS transistors connected in parallel in the MOS transistor pattern; Lp is the total channel length of mask for the gate pattern in the MOS transistor and has the relation of LP=NfxLdrawn; Ldrawn is the channel length or gate length in the MOS transistor; and Lmet is the metallurgical channel length. It should be realized that equation (1) can be simplified, since Nf appears in both the denominator and in Lp of the numerator. For the example of FIG. 4, 2ΔL=0.073 μm.

Figure 5C:
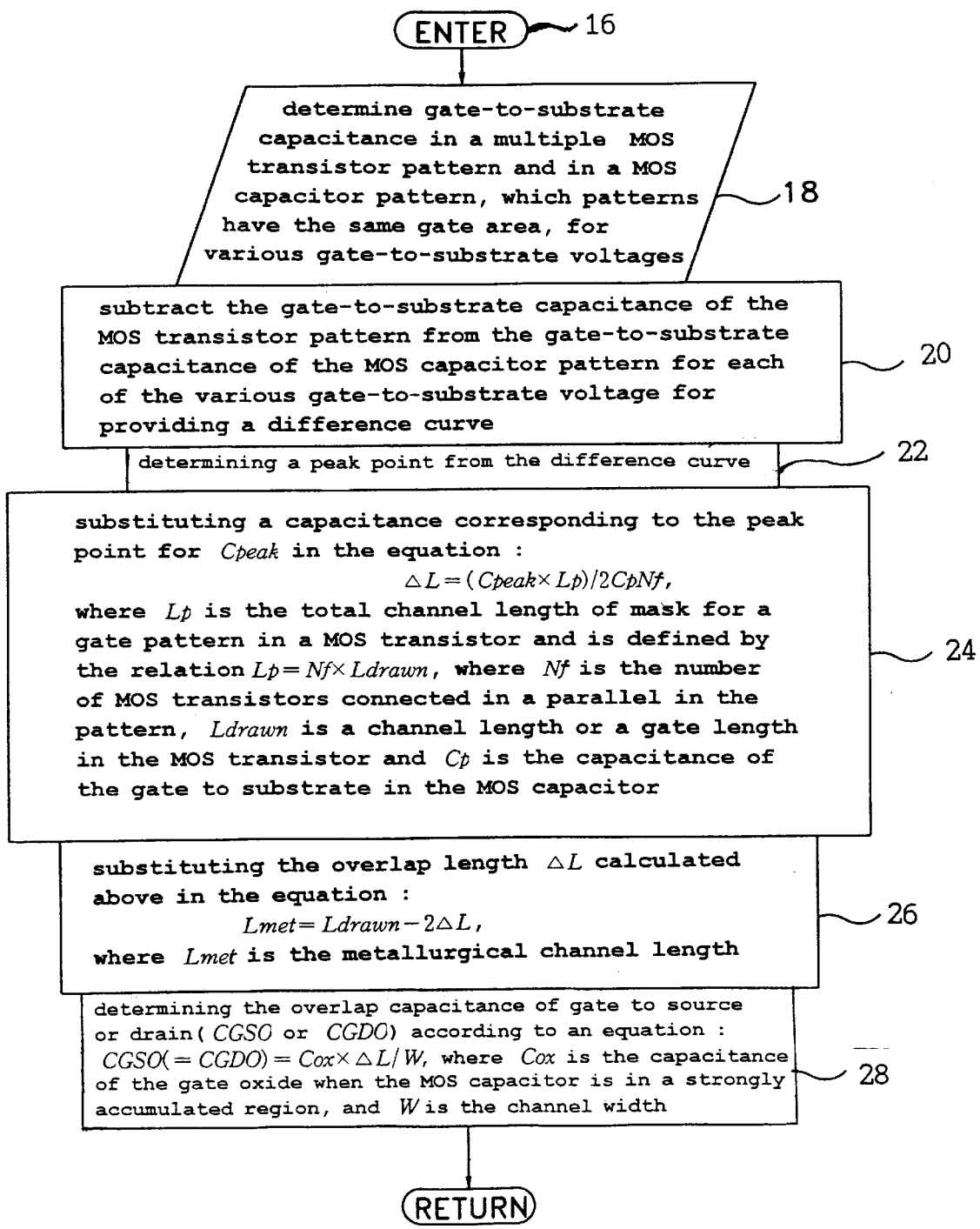
FIG. 5C illustrates a series of steps which may be carried out, according to the present invention, in order to determine the metallurgical channel length, as well as other parameters.

FIG. 5C shows a series of steps which may be carried out according to the above-described procedure. After entering in a step 16, a step 18 is executed to determine the gate-to-substrate capacitance in both the MOS transistor pattern and in the MOS capacitor pattern, for various gate-to-substrate voltages. The data for the transistor and capacitor patterns are then subtracted in a step 20 whereby a curve 3 such as shown in FIG. 4 is obtained. From this curve, a peak point (B) is determined and the corresponding peak capacitance (Cpeak) is substituted in an equation for the overlap length (ΔL) shown in a step 24, along with the total channel length (Lp), the capacitance (Cp) of the gate to substrate in the MOS capacitor and the number of MOS transistors connected in parallel (Nf). The thus-determined overlap length (ΔL) is then substituted in an equation for the metallurgical channel length (Lmet) shown in a step 26.

When the metallurgical channel length in a MOS transistor is defined to be Lmet, it has a relation of equation 2 below:

$$Lmet = Ldrawn - 2\Delta L \qquad (2)$$

In addition, an overlap capacitance CGS0 or CGD0 between the gate electrode 13 and the source or drain 12 can be determined by the equation 3 below, wherein: Cox is the capacitance of the gate oxide 14 when the MOS capacitor is in the strong accumulated region; W is the channel width in the MOS capacitor or MOS transistor; and ΔL is the overlap length. This is shown in a step 28 in FIG. 5C:

$$CGS0(=CGD0) = Cox * \Delta L / W \qquad (3)$$

Figure 5D:
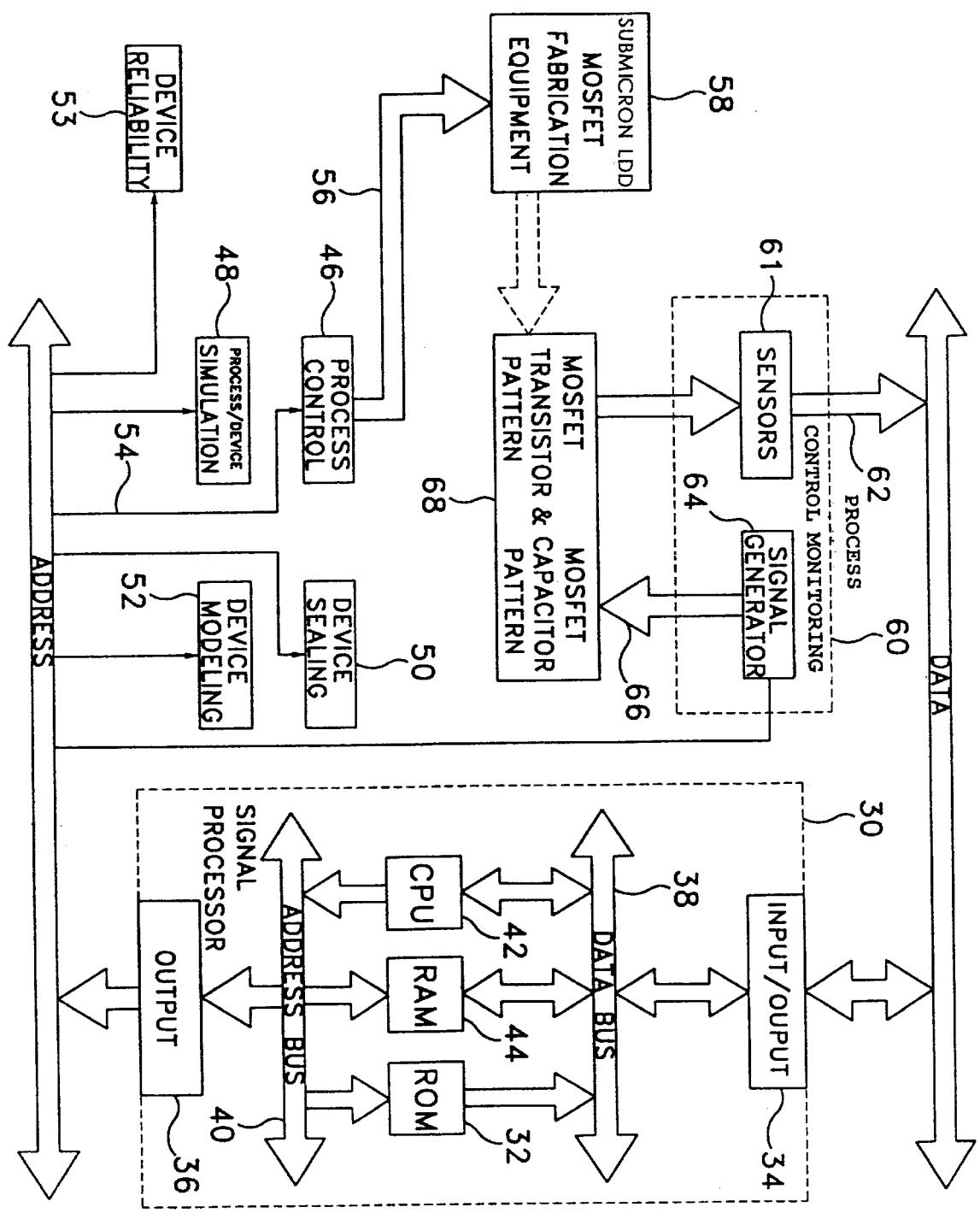
FIG. 5D shows a signal processor for carrying out the steps of FIG. 5C for process control and other purposes.

The steps shown in FIG. 5C may be incorporated into an automatic process such as shown in FIG. 5D, whereby the steps are encoded into a series of computer steps stored in a signal processor having a read-only memory (ROM) 32 for the storage of such steps in computer code. The signal processor 30 may comprise a typical general purpose signal processor, such as is well known, having an input/output port 34, an output port 36, a data bus 38, an address bus 40, a central processing unit (CPU) 42, a random-access memory (RAM) 44, and the read-only memory 32. Of course, a special purpose or dedicated processor will serve equally well.

As suggested above, the ROM 32 will typically store a sequence of logical steps to be performed according to the general outlines of the flow chart shown in FIG. 5C. The RAM is utilized to store intermediate values which need only be stored temporarily and which will normally disappear upon removal of power. The CPU 42 is responsible for controlling the sequence of logical steps outlined in FIG. 5C and for inputting and outputting various signals at the proper times.

The signal processor 30 may be used to output signals from its output port 36 for various purposes, including process control 46, process simulation 48, device scaling 50, device modeling 52, device reliability 53, or the like.

An output signal 54 is provided by the signal processor to the process control 46, in response to which, the process control provides an output signal on a line 56 to fabrication equipment 58 of the type used for fabricating submicron LDD MOSFETs, for instance.

In such a process control loop, a process control monitoring block 60 is provided, whereby parameters such as voltage and capacitance as described above are sensed by one or more sensors 61 which provide sensed signals on a line 62 to the data bus 38 of the signal processor 30. A signal generator 64 provides the desired bias and/or AC excitation to the MOSFET transistor pattern/MOSFET capacitor pattern 68.

In this way, the fabrication equipment 58 can be controlled so as to control various parameters in the process of fabricating submicron LDD MOSFETs, using the information developed according to the steps shown in FIG. 5C and provided by the signal processor 30 on the line 54 to the process control 46.

Needless to say, such information can also be used in the process simulation 48, device scaling 50 and device modeling blocks 52, which may themselves provide outputs (not shown) that can be used for various purposes, including process control.

Figure 6A:
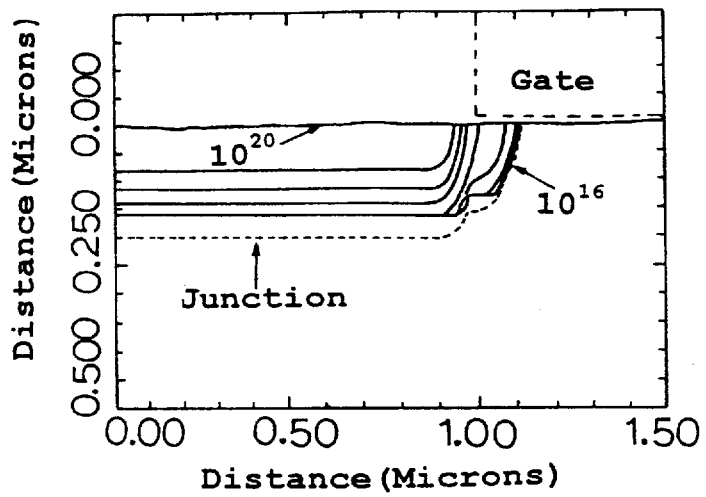
FIGS. 6A to 6C are views showing simulation result of a two-dimensional device simulator (MEDICI).
Figure 6B:
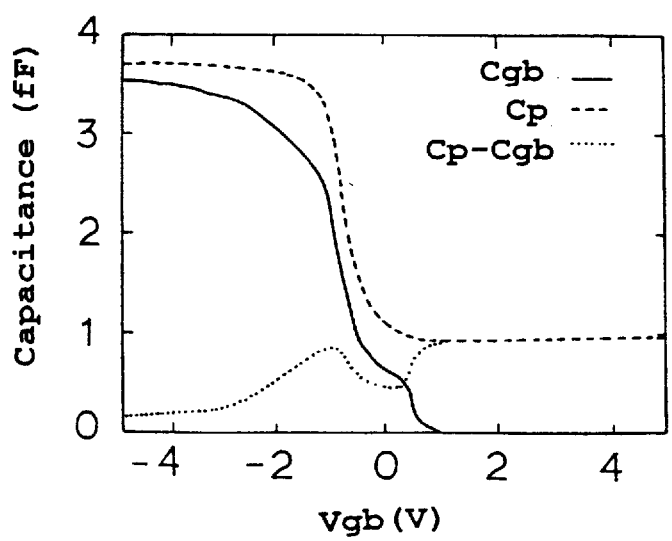
Figure 6C:
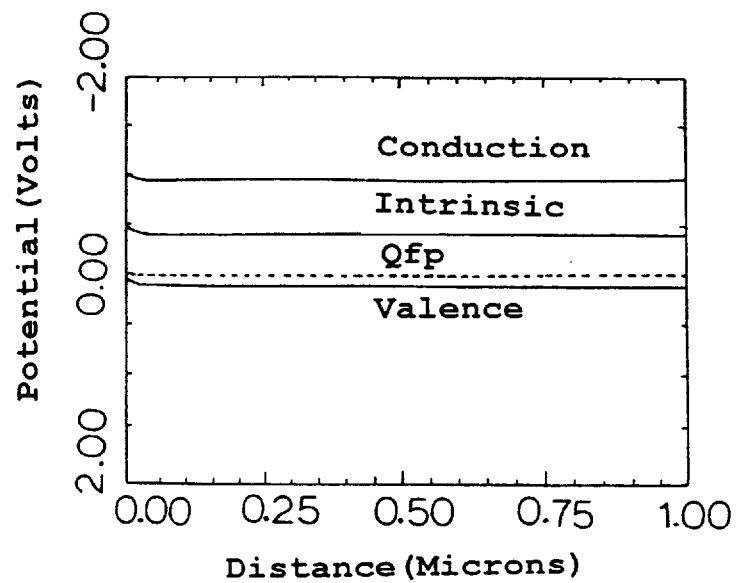

FIGS. 6A to 6C are views showing simulation result of a two-dimensional device simulator (MEDICI), as described below.

FIG. 6A shows one embodiment of a MOS transistor pattern for simulation, as in block 48 of FIG. 5D, of the metallurgical channel length and includes gate and source/drain regions. Each gate length of plate and finger type patterns is 1 μm, and the oxide thickness is 100 Å. The signal frequency applied by generator 64 of FIG. 5D is 10 kHz, and the amplitude thereof is 20 mV. The gate voltages of both patterns are swept from −5V to 5V. FIG. 6B is a capacitance result of the simulation obtained by utilizing the MOS transistor of FIG. 6A. The parameter 2ΔL determined using the above method at Vm=−1V is 0.275 μm, and 2ΔL from the channel surface doping profile is 0.255 μm.

The flat-band voltage is also an important parameter for device characterization, and various methods have been developed to determine flat-band voltage. See D. K. Schroder, "Semiconductor Material and Device Characterization", Chapter 6, Wiley, New York, 1990; and B. Ricco et al, "Oxide-Thickness Determination-in Thin-Insulator MOS Structures", IEEE Trans. Elect. Devices, Vol. 35, No. 4, pp. 432–437, April, 1988. FIG. 6C shows an energy band diagram at a voltage corresponding to a point where Cdiff has the peak in capacitance difference in the curve of FIG. 6B and in a direction orthogonal to an interface of the silicon substrate and the oxide in the MOS transistor.

FIG. 6C shows the result that the energy band is nearly flat. Accordingly, the voltage of gate to substrate corresponding to Cpeak in FIG. 6B can be defined to be a flat-band voltage.

Figure 7:
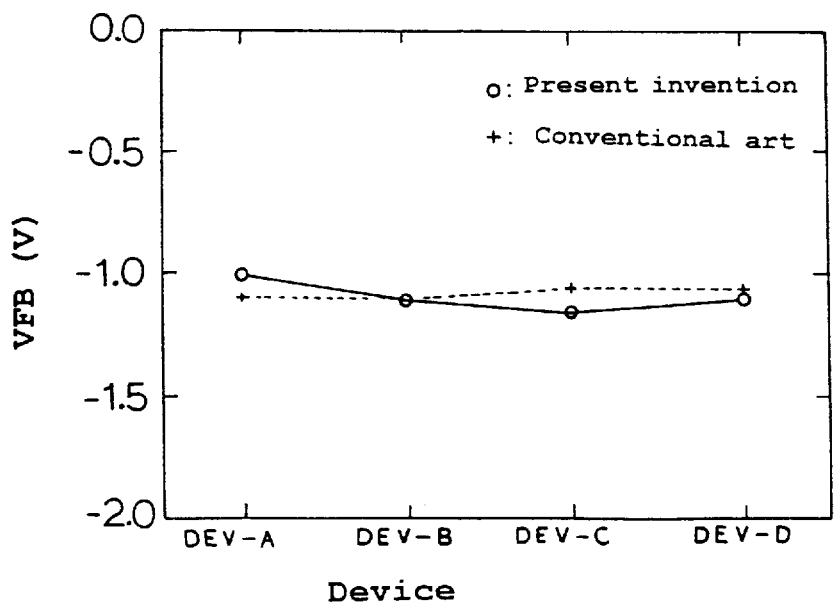
FIG. 7 is a graph showing a flat-band voltage in the conventional art and the present invention.

FIG. 7 is a graph showing the flat-band voltage in the conventional art and the present invention and is a result obtained from four test devices of DEV-A, DEV-B, DEV-C and DEV-D. The flat-band voltages from two methods show only 0.5 to −9.5% differences, so the voltage corresponding to the Cpeak obtained by the present invention can be regarded as the flat-band voltage. As a result, the method of the present invention for determining a flat-band voltage can be simply applied to a PCM program and it can easily determine the flat-band voltage.

As described previously, since the conventional method for determining a metallurgical channel length needs many MOS transistor test structures having different channel lengths, a large chip area is needed. In addition, the accuracy can be affected due to the parasitic effect.

The present method makes it possible to determine the metallurgical channel length by utilizing only one transistor test pattern, so that one of its merits is that a smaller chip area is required. Moreover, since the present method uses the capacitance of gate to substrate when the channel is the accumulated region, it can exclude the parasitic effect. Accordingly, the present invention makes it possible to determine an accurate metallurgical channel length and an overlap capacitance. A further merit is that it can also easily determine a flat-band voltage.

Other features, advantages and embodiments of the invention disclosed herein will be readily apparent to those exercising ordinary skill after reading the foregoing disclosure. In this regard, while specific embodiments of the invention have been described in considerable detail, variations and modifications of these embodiments can be effected without departing from the spirit and scope of the invention as described and claimed.

What is claimed is:

1. A method of measuring a metallurgical channel length of a channel of a semiconductor device, comprising the steps of:

(a) determining a gate-to-substrate capacitance in a multiple MOS transistor pattern and in a MOS capacitor pattern which have a same gate area for various gate-to-substrate voltages;

(b) subtracting the gate-to-substrate capacitance of the MOS transistor pattern from the gate-to-substrate capacitance of the MOS capacitor pattern for each of the various gate-to-substrate voltages for providing a difference curve;

(c) determining a peak point from the difference curve in step (b);

(d) substituting a capacitance corresponding to the peak point with a Cpeak parameter of equation (1) below and determining an overlap length $\Delta L$; and (e) substituting the overlap length $\Delta L$ determined in equation (1) for $\Delta L$ of equation (2) below and determining the metallurgical channel length Lmet, wherein, $\Delta L$ is the overlap length of gate and source/drain, Cpeak is the capacitance corresponding to the peak point in the capacitance differences curve, Cp is a capacitance of gate to substrate in the MOS capacitor pattern, Nf is a number of MOS transistors connected in parallel in the MOS transistor pattern, Lp is a total channel length of mask for a gate pattern in the MOS transistor pattern and is defined by a relation Lp=Nf× Ldrawn, Ldrawn is a channel length or a gate length in a MOS transistor in the MOS transistor pattern, and Lmet is the metallurgical channel length:

$$\Delta L = \frac{Cpeak \times Lp}{2CpNf} \qquad (1)$$

$$Lmet = Ldrawn - 2\Delta L. \qquad (2)$$

2. The method in accordance with claim 1, wherein the voltage corresponding to Cpeak is defined to be a flat-band voltage.

3. A method in accordance with claim 2, wherein said flat-band voltage is measured when the channel is in an accumulated region.

4. A method in accordance with claim 1, wherein an overlap capacitance of gate to source or drain in the MOS transistor, CGS0 or CGD0 respectively, is determined by an equation 3 below; Cox is a capacitance of a gate oxide when the MOS capacitor is in a strongly accumulated region; W is the channel width in the MOS capacitor or the MOS transistor, and $\Delta L$ is the overlap length:

$$CGS0(=CGD0)=Cox \cdot \Delta L/W \qquad (3).$$

5. A method in accordance with claim 1, further comprising the step of:

(f) using the determined metallurgical channel length for controlling or simulating a process for fabricating said semiconductor device.

6. A method in accordance with claim 1, further comprising the step of:

(g) using the determined metallurgical channel length for simulating, scaling or modeling said semiconductor device.

7. A method in accordance with claim 4, further comprising the step of:

(f) using the determined metallurgical channel length for controlling or simulating a process for fabricating said semiconductor device.

8. A method in accordance with claim 4, further comprising the step of:

(g) using the determined metallurgical channel length for simulating, scaling or modeling said semiconductor device.

9. The method in accordance with claim 5, wherein the voltage corresponding to Cpeak is defined to be a flat-band voltage.

10. The method in accordance with claim 6, wherein the voltage corresponding to Cpeak is defined to be a flat-band voltage.

11. A method in accordance with claim 5, wherein said flat-band voltage is measured when the channel is in an accumulated region.

12. A method in accordance with claim 6, wherein said flat-band voltage is measured when the channel is in an accumulated region.

13. An apparatus for measuring a metallurgical channel length of a channel of a semiconductor device, comprising:

(a) means for determining a gate-to-substrate capacitance in a multiple MOS transistor pattern and in a MOS capacitor pattern which have a same gate area for various gate-to-substrate voltages;

(b) means for subtracting the gate-to-substrate capacitance of the MOS transistor pattern from the gate-to-substrate capacitance of the MOS capacitor pattern for each of the various gate-to-substrate voltages for providing a difference curve;

(c) means for determining a peak point from the difference curve in step (b);

(d) means for substituting a capacitance corresponding to the peak point with a Cpeak parameter of equation (1) below and determining an overlap length $\Delta L$; and (e) means for substituting the overlap length ΔL determined in equation (1) for ΔL of equation (2) below and determining the metallurgical channel length Lmet, wherein, ΔL is the overlap length of gate and source/drain, Cpeak is the capacitance corresponding to the peak point in the capacitance differences curve, Cp is a capacitance of gate to substrate in the MOS capacitor pattern, Nf is a number of MOS transistors connected in parallel in the MOS transistor pattern, Lp is a total channel length of mask for a gate pattern in the MOS transistor pattern and is defined by a relation Lp=Nf× Ldrawn, Ldrawn is a channel length or a gate length in a MOS transistor in the MOS transistor pattern, and Lmet is the metallurgical channel length:

$$\Delta L = \frac{Cpeak \times Lp}{2CpNf} \quad (1)$$

$$Lmet = Ldrawn - 2\Delta L. \quad (2)$$

14. The apparatus in accordance with claim 13, wherein the voltage corresponding to Cpeak is defined to be a flat-band voltage.

15. An apparatus in accordance with claim 14, wherein said flat-band voltage is measured when the channel is in an accumulated region.

16. An apparatus in accordance with claim 13, wherein an overlap capacitance of gate to source or drain in the MOS transistor, CGS0 or CGD0 respectively, is determined by an equation 3 below; Cox is a capacitance of a gate oxide when the MOS capacitor is in a strongly accumulated region; W is the channel width in the MOS capacitor or the MOS transistor, and ΔL is the overlap length:

$$CGS0(=CGD0)=Cox*\Delta L/W \quad (3).$$

17. An apparatus in accordance with claim 16, further comprising:

(f) means for using the determined metallurgical channel length for controlling or simulating a process for fabricating said semiconductor device.

18. An apparatus in accordance with claim 16, further comprising:

(g) means for using the determined metallurgical channel length for simulating, scaling or modeling said semiconductor device.

19. An apparatus in accordance with claim 13, further comprising:

(f) means for using the determined metallurgical channel length for controlling or simulating a process for fabricating said semiconductor device.

20. An apparatus in accordance with claim 13, further comprising:

(g) means for using the determined metallurgical channel length for simulating, scaling or modeling said semiconductor device.

\* \* \* \* \*

UNITED STATES PATENT AND TRADEMARK OFFICE
CERTIFICATE OF CORRECTION

PATENT NO. : 5,821,766
DATED : October 13, 1998
INVENTOR(S) : Kim et al

It is certified that error appears in the above-identified patent and that said Letters Patent is hereby corrected as shown below:

At column 3, line 11, please cancel
"$L_{met} = L_{drawn} - 2\Delta L.\qquad(2)$" and substitute
--$L_{met} = L_{drawn} - 2\Delta L \qquad(2)$.--.

At column 4, line 25, please cancel "$4 \times 10^4 \ m^2$" and substitute --$4 \times 10^4 \ \mu m^2$--.

At column 8, line 1, please cancel
"$L_{met} = L_{drawn} - 2\Delta L.\qquad(2)$" and substitute
--$L_{met} = L_{drawn} - 2\Delta L \qquad(2)$.--.

At column 9, line 16, please cancel
"$L_{met} = L_{drawn} - 2\Delta L.\qquad(2)$" and substitute
--$L_{met} = L_{drawn} - 2\Delta L \qquad(2)$.--.

Signed and Sealed this

Nineteenth Day of January, 1999

Attest:

Attesting Officer

*Acting Commissioner of Patents and Trademarks*